US008656235B2

(12) United States Patent
Geukes et al.

(10) Patent No.: US 8,656,235 B2
(45) Date of Patent: Feb. 18, 2014

(54) VERIFYING AND DETECTING BOUNDARY SCAN CELLS TO INPUT/OUTPUT MAPPING

(75) Inventors: Benedikt Geukes, Stuttgart (DE); Matteo Michel, Chemnitz (DE); Carsten Schmitt, Stuttgart (DE); Manfred H. Walz, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/305,498

(22) Filed: Nov. 28, 2011

(65) Prior Publication Data

US 2013/0139014 A1    May 30, 2013

(51) Int. Cl.
*G01R 31/28*    (2006.01)

(52) U.S. Cl.
USPC .......................................... 714/727

(58) Field of Classification Search
USPC .......................... 714/726, 727, 729
See application file for complete search history.

(56) References Cited

U.S. PATENT DOCUMENTS

| | | | |
|---|---|---|---|
| 4,293,919 A | | 10/1981 | Dasgupta et al. |
| 5,517,637 A * | | 5/1996 | Bruce et al. ................ 703/15 |
| 6,012,155 A * | | 1/2000 | Beausang et al. ............. 714/727 |
| 7,308,656 B1 * | | 12/2007 | Roberts et al. .............. 716/103 |
| 7,536,619 B2 * | | 5/2009 | Satsukawa et al. ........... 714/732 |
| 7,590,905 B2 * | | 9/2009 | Abdel-Hafez et al. ......... 714/726 |
| 7,600,166 B1 | | 10/2009 | Dunn et al. |
| 7,685,327 B1 * | | 3/2010 | Jacobson et al. ............. 710/10 |
| 7,865,792 B2 * | | 1/2011 | Lin et al. ................... 714/728 |
| 7,945,830 B2 * | | 5/2011 | Wang et al. ................. 714/726 |
| 7,962,885 B2 * | | 6/2011 | Chakraborty et al. ........ 714/726 |
| 2009/0013226 A1 | | 1/2009 | Swoboda et al. |
| 2012/0191403 A1 | | 7/2012 | Geukes et al. |

OTHER PUBLICATIONS

HéLY, David et al., "Scan Design and Secure Chip", Proceedings. 10th IEEE International Symposium on On-Line Testing, IEEE 2004.
Lee, Jeremy et al., "Securing Scan Design Using Lock & Key Technique", 20th IEEE International Symposium on Defect and Fault Tolerance in VLSI Systems, IEEE 2005 , 9 pages.
Mukhopadhyay, D. et al., "CryptoScan: A Secured Scan Chain Architecture", Proceedings of the 14th Asian Test Symposium (ATS '05) 1081-7735/05 Department of Computer Science and Engg Indian Institute of Technology, Kharagpur, India 2005 , 6 pages.
"IEEE Standard Test Access Port and Boundary-Scan Architecture", IEEE standard 1149.1a(IEEE standard 1149.1-1990 revision) Mar. 27, 2008 , 208 pages.

* cited by examiner

*Primary Examiner* — James C Kerveros
(74) *Attorney, Agent, or Firm* — DeLizio Gilliam, PLLC

(57) ABSTRACT

In some embodiments, a computer-implemented method includes receiving, in a processor, a device description code identifying components of a device and connections between the components, wherein some of the components and connections form boundary cells used for testing the device. The method can include processing, in the processor, the device description code to determine that the components and the connections meet a standard governing components and connections necessary for the boundary cells. The method can also include traversing the connections between the components to determine that the connections meet the standard, and reporting, via one or more output devices, that the device complies with the standard.

20 Claims, 8 Drawing Sheets

VERIFYING AND DETECTING BOUNDARY SCAN CELLS TO INPUT/OUTPUT MAPPING

BACKGROUND

Embodiments of the inventive subject matter generally relate to the field of integrated circuit testing, and more particularly to verifying input/output mapping for boundary scan cells.

Boundary scan is a method for testing connections (e.g., wires) on printed circuit boards, and sub-blocks inside integrated circuits. The Joint Test Action Group (JTAG) developed a specification for boundary scan testing. The specification was standardized in 1990 as IEEE Std. 1149.1-1990. The boundary scan architecture provides a means to test interconnects and clusters of logic, memories, and other components without using physical test probes. The boundary scan architecture adds one or more "test cells", which are connected to each pin of the device. Each test cell can selectively override functionality of a pin to which the test cell is connected. These cells can be programmed via the JTAG scan chain to drive a signal onto a pin and across an individual trace on the board. The cell at the destination of the board trace can then be programmed to read the value at the pin, verifying the board trace properly connects the two pins. If the trace is shorted to another signal, or if the trace has been cut, the correct signal value will not show up at the destination pin, and the board will be observed to have a fault.

SUMMARY

In some embodiments, a computer-implemented method includes receiving, in a processor, a device description code identifying components of a device and connections between the components, wherein some of the components and connections form boundary cells used for testing the device. The method can include processing, in the processor, the device description code to determine that the components and the connections meet a standard governing components and connections necessary for the boundary cells. The method can also include traversing the connections between the components to determine that the connections meet the standard, and reporting, via one or more output devices, that the device complies with the standard.

Some embodiments include a computer-implemented method for determining input/output connectivity of a boundary scan structure in an electronic device. The method can include receiving, in one or more processors, a device description code enumerating components and connections between the components, wherein the components include scan latches, update latches, multiplexers, input pads, and output pads, and wherein the connections include input paths and output paths, and wherein one or more of the components are part of the boundary scan structure. The method can also include traversing, in the one or more processors, the connections and components to determine that the boundary scan structure conforms to a specified design, wherein the traversing includes, a first traversal backwards from the scan latches to the input pads, wherein the first traversal moves through output paths of certain ones of the multiplexers, through input paths of the certain ones, and to the output pads. The method can also include a second traversal forwards from the scan latches to the update latches. The method can also include a third traversal forwards from the update latches to the output pads, wherein the third traversal moves through input path and output paths of some of the multiplexers, and on to the output pads, and recording, in a memory device, the paths that lead to the input pads and output pads. The method can also include identifying, based on the traversing, boundary cells that are part of the boundary scan structure.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Some integrated circuits use boundary scanning to facilitate testing. As noted above, the boundary scan architecture adds one or more "test cells", which are connected to each pin of a device (e.g., a chip mounted on a circuit board). Each test cell can selectively override functionality of a pin to which the test cell is connected. These cells can be programmed to drive signals onto a pin and across an individual trace on a circuit board. The cell at the destination of the board trace can then be programmed to read the value at the pin, verifying the board trace properly connects the two pins. This type of testing is typically performed in late stages of a production process, after devices have been constructed. Such testing requires external devices to drive signals through the devices under test. However, some embodiments of the inventive subject matter enable chip makers to verify connectivity between components of a device before the device is constructed. More specifically, some embodiments perform a structural design analysis to verify proper a device's boundary scan to /IO connectivity, and to generate a boundary scan latch to I/O mapping for the device.

Some embodiments of the inventive subject matter verify connectivity between components of a device by analyzing an encoded description of the device. The encoded description indicates components in the device, and connections between the components. Some embodiments analyze the encoded description to verify that a device's components and connections comply with one or more standards, such as IEEE Std. 1149.1-1990 or 1149.6. By verifying device connectivity before the device is constructed, device makers can avoid constructing chips that do not meet connectivity requirements of a standard. Furthermore, some embodiments provide a method for detecting a device's connectivity errors without a functional simulator, without running clocks, and/or without other components necessary for driving signals through the device. After the embodiments have verified device connectivity, chip makers can construct the device and test whether the fabrication process produced a properly working device. The following discussion of FIG. 1 will provide a brief overview of some embodiments of the inventive subject matter.

Figure 1:
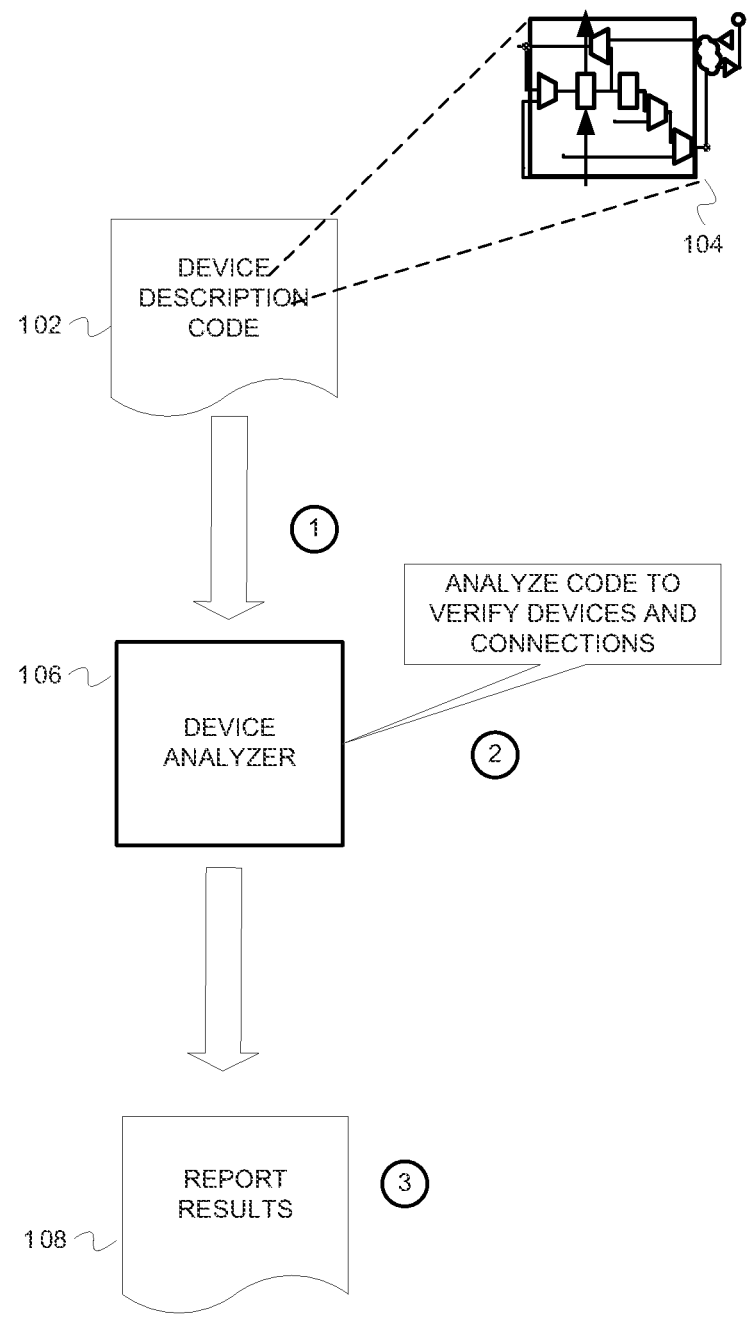
FIG. 1 is a conceptual diagram showing how some embodiments verify connectivity of a device by analyzing encoded representation the device.

FIG. 1 is a conceptual diagram showing how some embodiments verify connectivity of a device by analyzing encoded representation the device. FIG. 1 shows 3 stages of operations for verify connectivity of a device. During stage 1, a device analyzer 106 receives device description code 102, which describes a device 104. In some embodiments, the device description code includes a "netlist" indicating connectivity between components of the device 104. In some instances, the netlist can include connections for all components on a device, including boundary scan cells, The netlist can be represented in a vendor-neutral format, such as Electronic Design Interchange Format (EDIF) or any other suitable format. Although shown alone in FIG. 1, the device analyzer can reside inside a computer, and the device description code 102 can reside on the storage device in the computer.

During stage 2, the device analyzer 106 analyzes the device description code (e.g., a netlist) to verify connections of the device 104. If the code indicates that the device includes a scan latch, the device analyzer 106 traverses connectivity from the scan latch backward to an input pad (the input pad should also be identified in the device description code). Additionally, the device analyzer 106 traverses connectivity forward to an output pad (also identified in the code). In some instances, the device analyzer 106 determines whether the device 104 includes components and connectivity compliant with a standard, such as IEEE Std, 1149.1. If the traversal does not reveal components necessary for compliance to the standard (or any other suitable criteria), the device analyzer 106 may make a record indicating that certain components and/or connections are missing from the device. If the device analyzer 106 finds all necessary connections and components, it may record the finding.

During stage 3, the device analyzer 106 reports the results of its analysis. If the device 104 does not include all connections and components necessary to comply with the standard, device designers may need to re-work the device's design.

Figure 2:
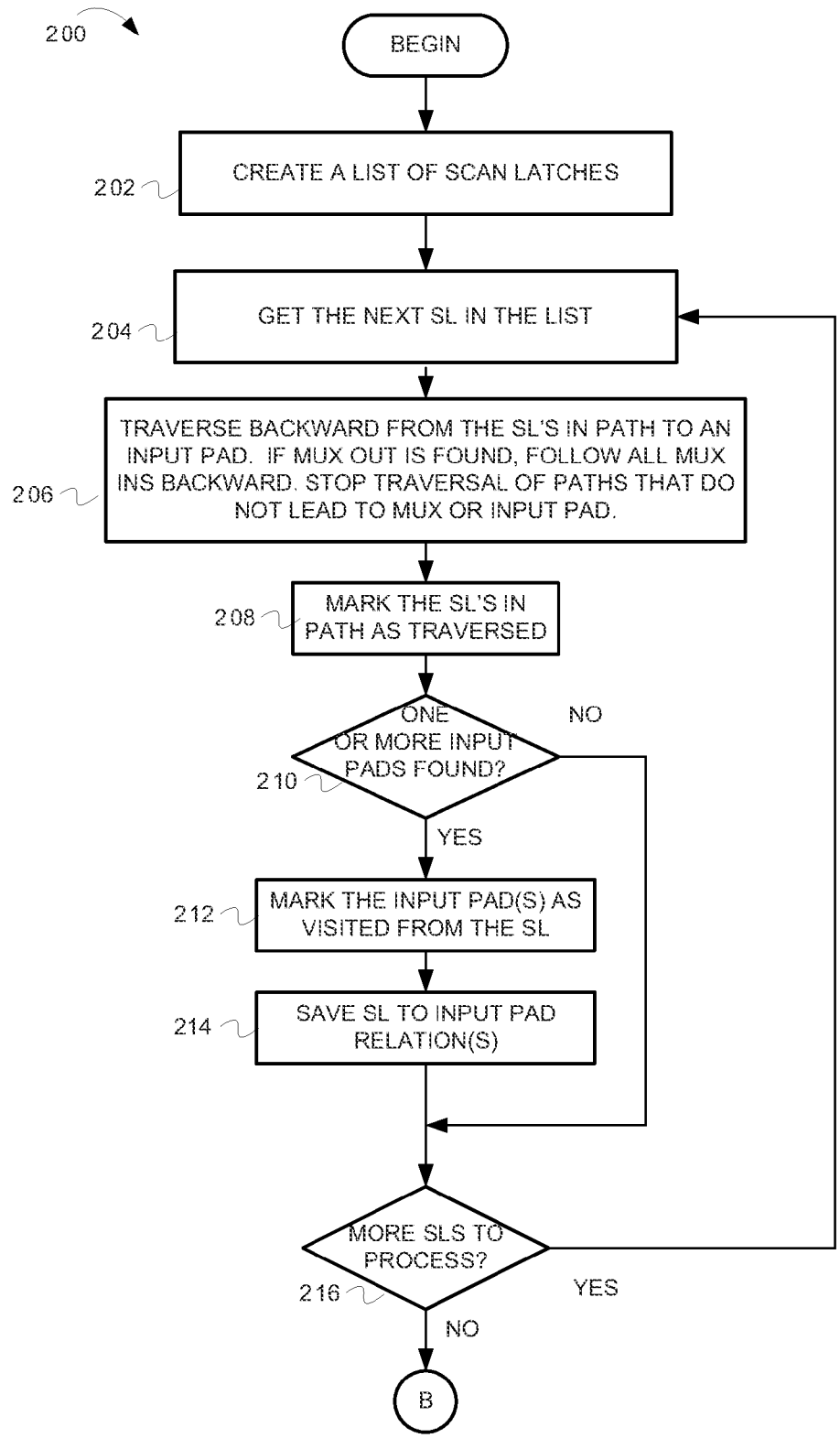
FIG. 2-4 is a flow diagram illustrating operations for verifying connections and components of a device, according and that subject matter.
Figure 3:
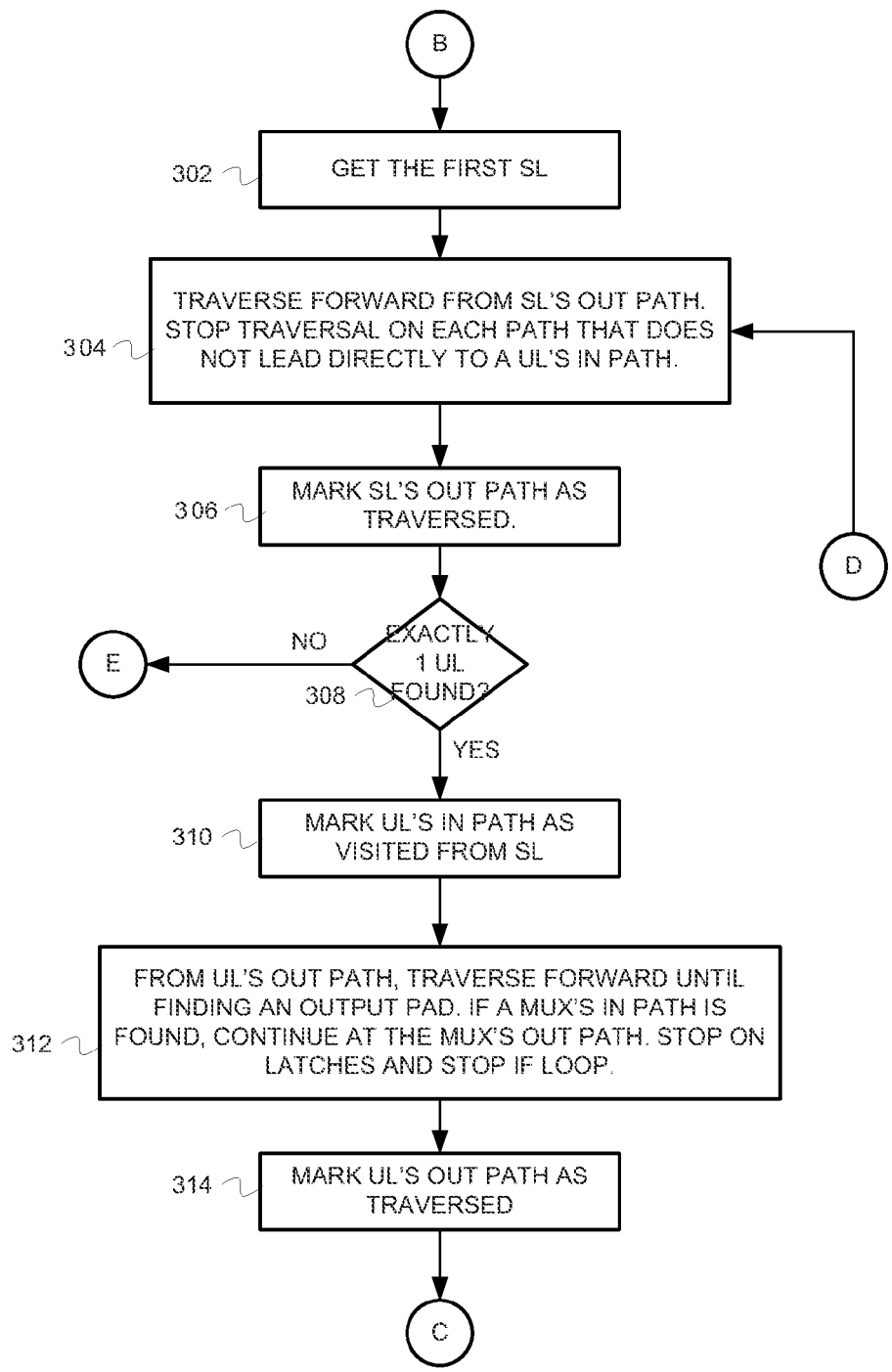
Figure 4:
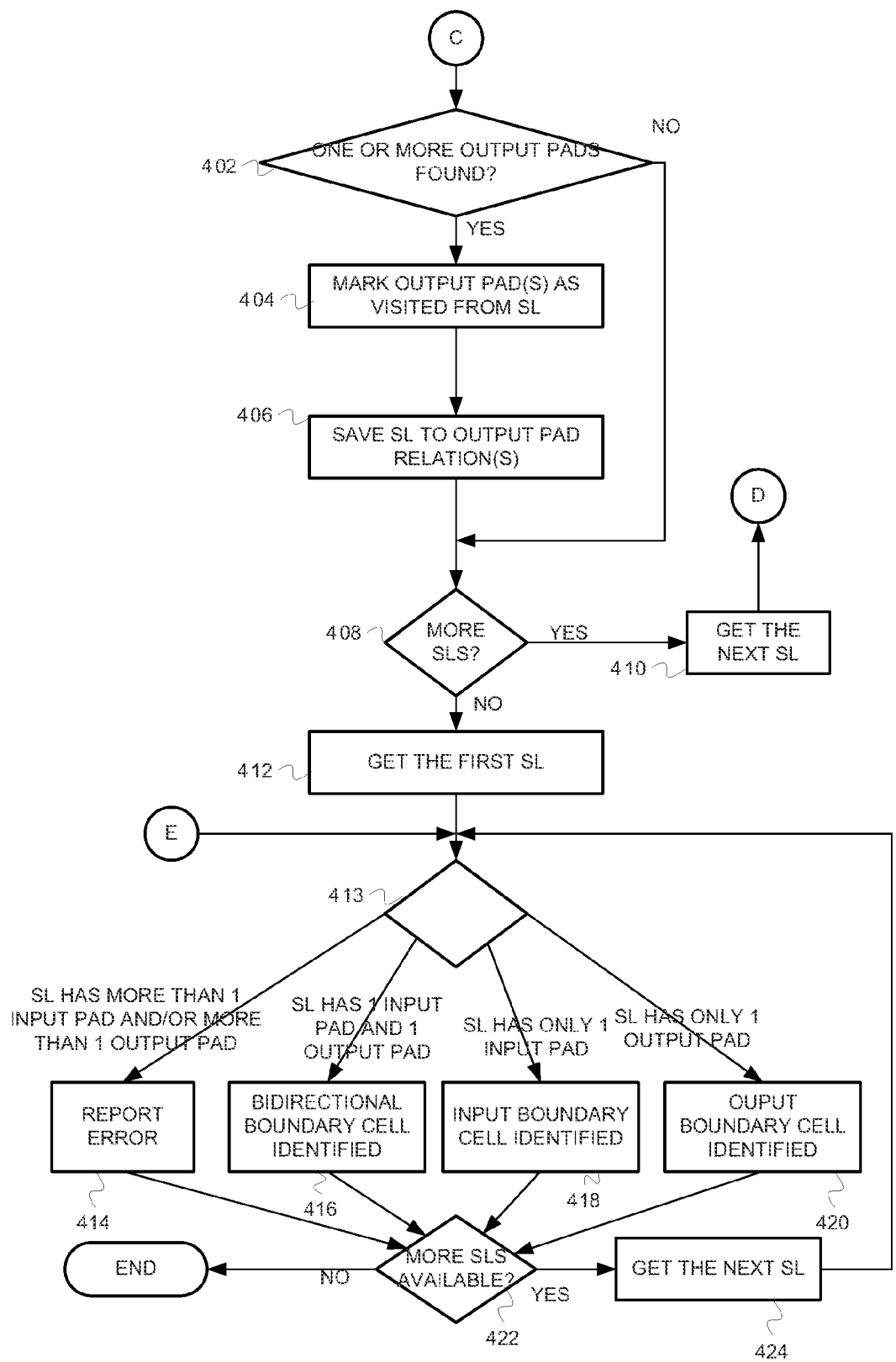
Figure 5:
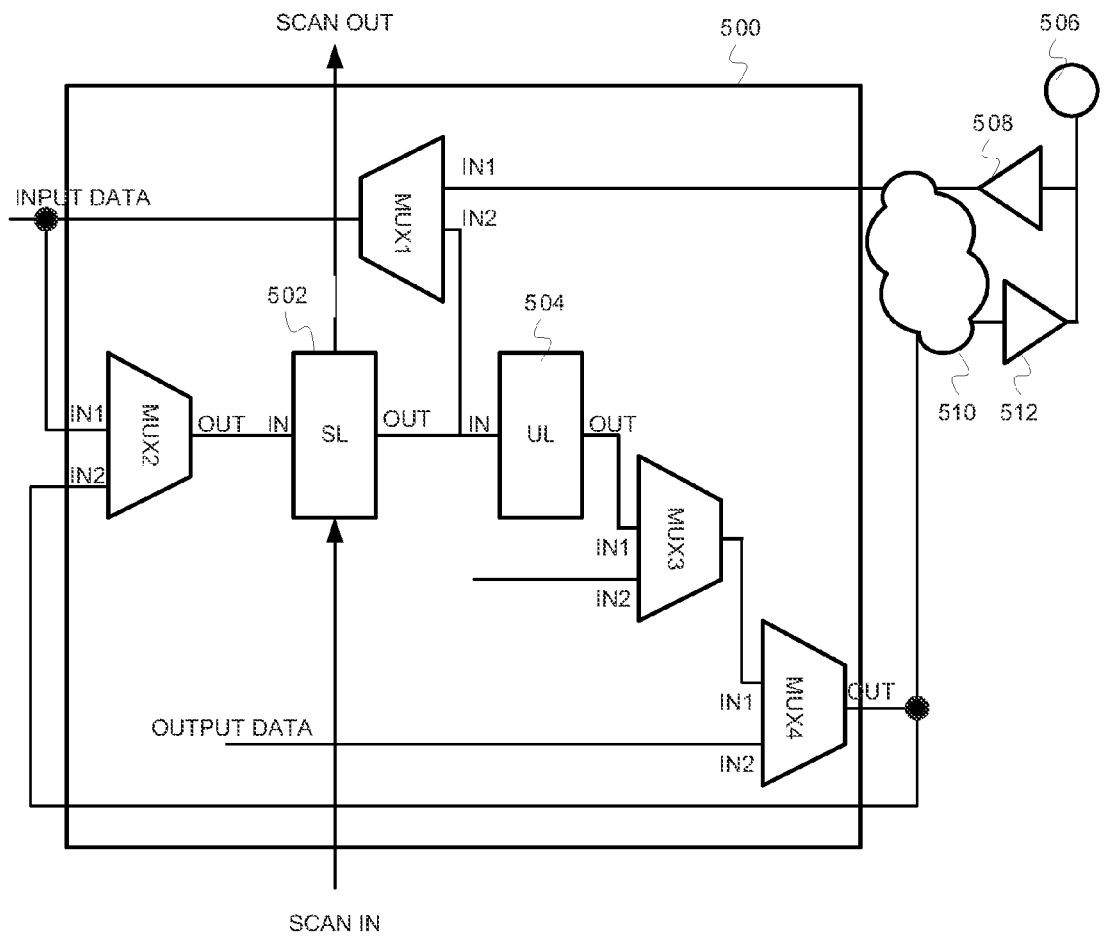
FIG. 5-7 are block diagrams showing graphical depictions of devices represented in a device description code.
Figure 6:
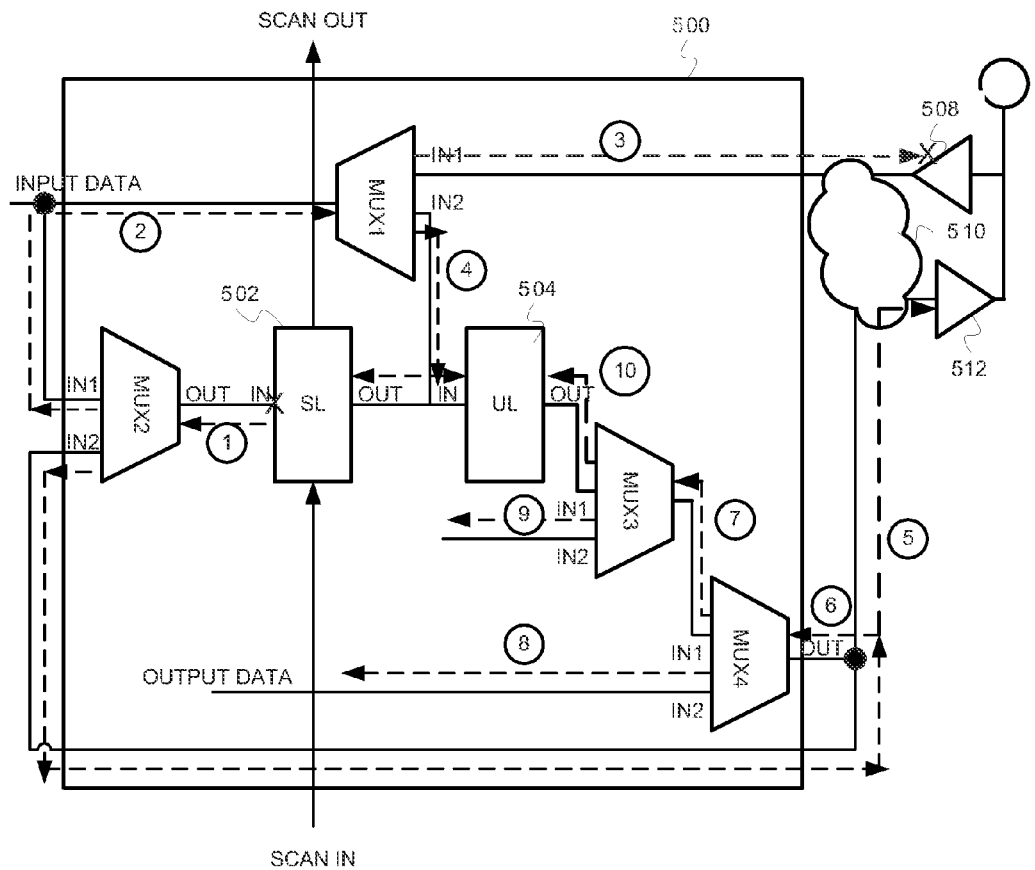
Figure 7:
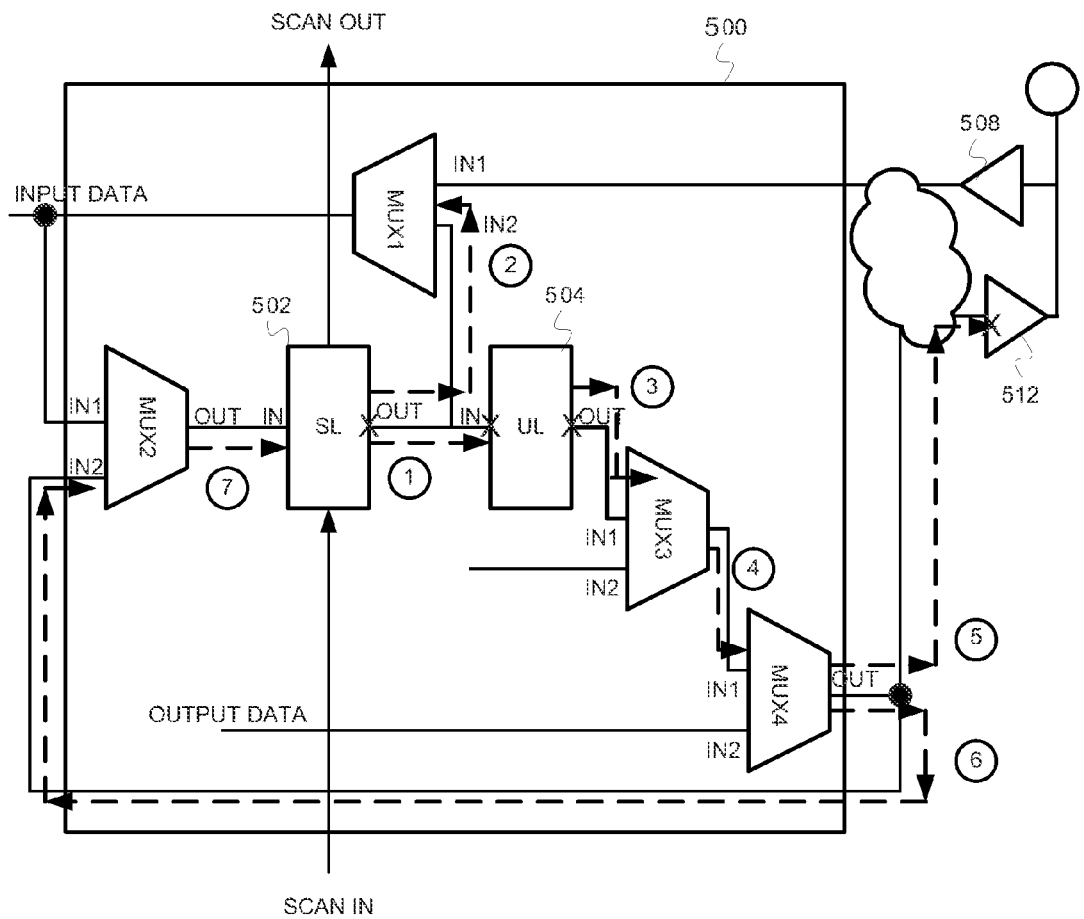

The following discussion will describe embodiments in greater detail. For example, the discussion will elaborate on operations for traversing connection paths represented in a netlist or other device description code. More specifically. FIG. 2-4 are flow diagrams including operations for traversing connections indicated in a device description code (e.g., netlist). FIGS. 5-7 show a device and graphical representations of traversal paths through the device. The discussion will continue with FIG. 2.

FIG. 2 is a flow diagram illustrating operations for verifying connections and components of a device, according and that subject matter. In some embodiments, the operations of the flow 200 are performed by a device analyzer, as described in FIG. 1. The flow 200 begins at block 202, where the device analyzer receives a netlist (or other suitable device description code) enumerating components and connections in a device. FIG. 5 shows an example device that may be represented in the netlist. In FIG. 5, the device 500 includes four multiplexers (shown as mux1, mux2, mux3, and mux4), a scan latch 502, an update latch 504, latch-free logic area 510, input pad 508, and output pad 512, and various connections between these components. Although not shown, the device 500 can include any suitable number of devices, including devices that are not relevant to the operations described herein. The device analyzer creates a list of scan latches based on the netlist. The device analyzer can create the list of scan latches from the scan latches enumerated in the netlist. Flow continues at block 204.

At block 204, the device analyzer gets the next scan latch in the list of scan latches. At this point, on the first pass through the flow, the device analyzer gets the scan latch at the head of the list. On subsequent passes (see looping structure running from block 216 to block 204), the device analyzer moves to the next item in the list of scan latches. Flow continues at block 206.

At block 206, the device analyzer traverses backward from the scan latch's input path (i.e., connection leading into the scan latch) to an input pad. If, during the traversal, the analyzer finds an input path for the multiplexer, the analyzer will traverse that multiplexer's output paths backwards, in search of the input pad. For paths that do not lead to a multiplexer or input pad, the device analyzer stops the traversal. FIG. 6 provides a graphical representation of the traversal performed at block 206.

FIG. 6 shows a graphical representation of block 206's traversal occurring in 10 stages. Beginning at the scan latch 502 (see stage 1), the traversal moves backward through the scan latch's input path and into mux2's output path. As noted above, if the traversal leads to a multiplexer, it continues traversing the input paths of that multiplexer. From mux2 (see stage 2), the traversal proceeds along mux2's first input path backward and upward to mux 1. Again, the traversal continues by traversing the input paths of mux 1 (see stages 3 and 4). Stage 3 leads to an input pad 508. Stage 4 leads back to the scan latch 502, and to the update latch 504. Because the scan latch and update latch are not multiplexers (see FIG. 2's block 206), the device analyzer stops this leg of the traversal.

Stages 5-10 arise from traversing mux2's second input path. More specifically, stage 5 leads from mux2 to the output pad 512. Stage 6 leads to mux 4's output path. Traversing mux4's input paths ultimately leads to mux3 (shown as mux3) and the update latch 504. As a result of the traversal, the device analyzer has found paths leading from the scan latch's input path to the input pad 508 and output pad 508. Referring back to FIG. 2, flow continues at block 206.

At block 208, the device analyzer marks the scan latch's input path as having been traversed. At block 210, the device analyzer determines whether one or more input pads were found during the traversal. If the traversal identified one or more input pads, the flow moves to block 212, where the device analyzer marks the input pad(s) as visited (FIG. 6 shows an "X" mark on the input pad 508). At block 214, the device analyzer saves the path from the scan latch 502 to the input pad 508. At block 216, if the scan latch list (created at block 202) has more scan latches to process, the flow loops back to block 204. Otherwise, flow continues at "B" shown in FIG. 3.

The operations shown in FIG. 3 continue traversing connections in the device 500, At block 302, the device analyzer gets the first scan latch in the list of scan latches (i.e., the scan latch list created at block 202). At block 304, the device analyzer traverses forward from the scan latch's output path to an update latch. The device analyzer stops traversing paths that do not lead directly to an update latch's input path. FIG. 7 provides a graphical representation of the traversal operation of block 304. In FIG. 7, the traversal leads from the output path of the scan latch 502 to mux2 (see stage 1.). Because mux2 is not an update latch, the traversal does not proceed from mux2. As shown, there is another traversal path leading from the scan latch 502. This path leads to the update latch 504 (see stage 2). Upon reaching the update latch 504, the operation at block 304 is complete. The flow continues at block 306, where the device analyzer marks the scan latch's output path as "traversed" (in FIG. 7, see "X" mark on the scan latch's output path).

At block 308, the device analyzer determines how many update latches were found by the traversal of block 304. In the example shown in FIG. 7, the device analyzer found exactly one update latch. If the traversal performed at block 304 finds exactly one update latch, flow continues at block 310. Otherwise, flow continues at 413 of FIG. 4 (FIG. 4 is discussed below).

At block 310, the device analyzer marks the update latch's input path as being traversed from the scan latch's output path (see "X" mark on the scan latch 502, in FIG. 6). Flow continues at block 312.

At block 312, the device analyzer traverses from the update latch's output path looking for an output pad. During the traversal, if the device analyzer finds a multiplexer's input path, it continues on the multiplexer's output path. During the traversal, if the device analyzer finds a latch, the analyzer stops the traversal. That is, if the device analyzer finds a latch, it will not proceed traversing past the latch, but may continue with un-traversed paths from a multiplexer, FIG. 7 shows an example of the traversal of block 312.

In FIG. 7, stages 3-7 show the traversal from the output path of the update latch 504. The traversal leads to mux3 (stage 3), and then mux4 (stage 4). Mux4's output path bifurcates into two paths. One output path leads upward (see stage 5) to the output pad 512, and the other leads downward and left to mux2 (see stage 6). Mux2's output path leads to the scan latch 502 (stage 7), which causes that leg of the traversal to end. After stage 7, all paths have been traversed according to block 312 of FIG. 3. From block 312, the flow continues at block 314.

At block 314, the device analyzer marks the update latch's output path as "traversed" (see "X" mark on the update latch 504, in FIG. 7). From 314, the flow continues in FIG. 4, at block 402.

In FIG. 4, at block 402, the device analyzer determines whether the traversal revealed one or more output pads. If the traversal revealed one or more output pads, the flow continues at block 404. Otherwise, the flow continues at block 408.

At block 404, the device analyzer marks the output pad(s) as visited from the current scan latch. In FIG. 7, the marketing of block 404 is shown as an "X" mark on the output pad 512. Next, the flow continues at block 406, where the device analyzer saves the relation between output pad and the scan latch. For example, in some embodiments, the device analyzer saves a representation of the path from the scan latch 502 to the output pad 512. The flow continues at block 408.

At block 408, the device analyzer determines whether there are more scan latches to process in the list of scan latches (created at block 202 of FIG. 2). If there are more scan latches to process, the flow continues at block 410, where the device analyzer gets the next scan latch from the list, and proceeds at block 304 of FIG. 3. From block 304, the flow will repeat operations of FIGS. 3 and 4. However, if there are no more scan latches to process, flow continues at block 412.

At block 412, the device analyzer determines types of boundary cells in the device. For the first scan latch in the list, the device analyzer determines whether: 1) the scan latch has more than one input pad and/or more than one output pad, 2) the scan latch has one input pad and one output pad, 3) the scan latch has only one input pad, or 4) the scan latch has only one output pad.

If the scan latch has more than one input pad and/or more than one output pad, the flow continues at block 414, where the device analyzer reports an error. In some embodiments, the error indicates that the device does not conform to a particular standard or other rule set.

If the scan latch has one input pad and one output pad, flow continues at block 416, where a bidirectional boundary cell is identified.

If the scan latch has only one input pad, flow continues at block 418, where the device analyzer identifies an input boundary cell.

If the scan latch has only one output pad, the flow continues at block 420, where the device analyzer has identified and output boundary cell.

As shown in FIG. 4, blocks 414, 416, 418, and 420 flow into block 422. At block 422, if there are more scan latches in the list of scan latches, the device analyzer gets the next scan latch in the list, and continues at block 413. The device analyzer loops through blocks 413-424 for all scan latches in the list. After processing all scan latches, the flow ends.

As will be appreciated by one of ordinary skill in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
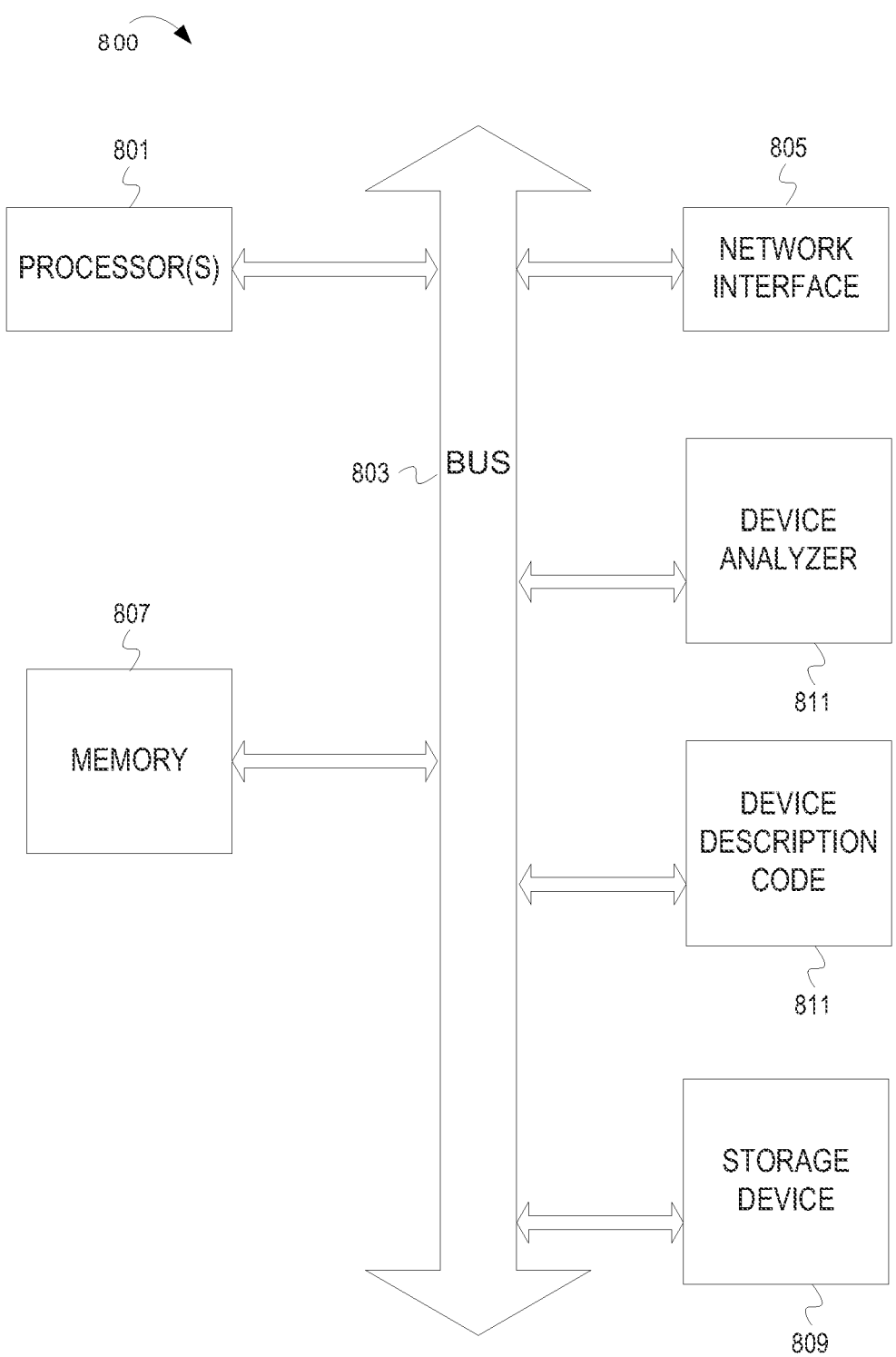
FIG. 8 is a block diagram illustrating a computer system for verifying connectivity of a device, according to some embodiments of the inventive subject matter.

FIG. 8 depicts an example computer system. A computer system includes a processor unit 801 (possibly including multiple processors, multiple cores, multiple nodes, and/or implementing multi-threading, etc.). The computer system includes memory 807. The memory 807 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus YY03 (e.g., PCI, ISA, PCI-Express, HyperTransport®, InfiniBand®, NuBus, etc.), a network interface YY05 (e.g., an ATM interface, an Ethernet interface, a Frame Relay interface, SONET interface, wireless interface, etc.), and a storage device(s) 809 (e.g., optical storage, magnetic storage, etc.). In some embodiments, the system memory 807 embodies functionality to implement embodiments described above. For example, the system memory 807 may include one or more functionalities that facilitate the verification of connections in a device, as described herein. The memory 807 can include a device analyzer 811 and device description code 812 (although the device analyzer 811 and device description code 812 are shown outside the memory 807). Any one of these functionalities may be partially (or entirely) implemented in hardware and/or on the processing unit 801. For example, the functionality may be implemented with an application specific integrated circuit, in logic implemented in the processing unit 801, in a co-processor on a peripheral device or card, etc. Further, realizations may include fewer or additional components not illustrated in FIG. 8 (e.g., video cards, audio cards, additional network interfaces, peripheral devices, etc.). The processor unit 801, the storage device(s) YY09, and the network interface 805 are coupled to the bus 803. Although illustrated as being coupled to the bus 803, the memory 807 may be coupled to the processor unit 801.

While the embodiments are described with reference to various implementations and exploitations, it will be understood that these embodiments are illustrative and that the scope of the inventive subject matter is not limited to them. In general, techniques for verifying connections in a device as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

The description that follows includes exemplary systems, methods, techniques, instruction sequences and computer program products that embody techniques of the present inventive subject matter. However, it is understood that the described embodiments may be practiced without these specific details. In other instances, well-known instruction instances, protocols, structures and techniques have not been shown in detail to avoid obfuscating the description.

What is claimed is:

1. A computer-implemented method comprising:
   receiving, in a processor, a device description code identifying components of a device and connections between the components, wherein one or more of the components and connections form boundary cells used for testing the device;
   processing, in the processor, the device description code to determine that the components and the connections meet a standard that governs components and connections necessary for the boundary cells;
   traversing, in the processor, the connections between the components to determine that the connections meet the standard;
   reporting, via one or more output devices, that the device complies with the standard.

2. The method of claim 1 wherein the devices include one or more of a multiplexer, a scan latch, an update latches, an input pad, and an output pad.

3. The method of claim 1 wherein the traversing includes traversing from a scan latch's input path to output paths of multiplexers, and on to one or more output pads.

4. The method of claim 3 wherein the traversing further includes traversing from the scan latch to the input path of an update latch, through multiplexers, and on to one or more input pads.

5. The method of claim 1 wherein the standard is one of IEEE Standard 1149.1 and 1149.6.

6. A computer-implemented method for determining input/output connectivity of a boundary scan structure in an electronic device, the method comprising:

receiving, in one or more processors, a device description code enumerating components and connections between the components, wherein the components include scan latches, update latches, multiplexers, input pads, and output pads, and wherein the connections include input paths and output paths, and wherein one or more of the components are part of the boundary scan structure;

traversing, in the one or more processors, the connections and components to determine that the boundary scan structure conforms to a specified design, wherein the traversing includes, a first traversal backwards from the scan latches to the input pads, wherein the first traversal moves through output paths of certain ones of the multiplexers, through input paths of the certain ones, and to the output pads;

a second traversal forwards from the scan latches to the update latches;

a third traversal forwards from the update latches to the output pads, wherein the third traversal moves through input path and output paths of one or more of the multiplexers, and on to the output pads;

recording, in a memory device, the paths that lead to the input pads and output pads; and identifying, based on the traversing, boundary cells that are part of the boundary scan structure.

7. The method of claim 6, wherein the specific design complies with one or more standards including IEEE Standard 1149.1 and IEEE Standard 1149.6.

8. The method of claim 6, wherein the device description code includes a netlist.

9. The method of claim 6, wherein the device description code is in Electronic Design Interchange Format.

10. The method of claim 6, wherein the boundary cells include input boundary cells and output boundary cells.

11. The method of claim 6, wherein the detection of a valid boundary scan structure is performed without any functional simulation.

12. The method of claim 6, wherein the detection of a valid boundary scan structure is performed without any application of test patterns.

13. The method of claim 6, wherein the detection of a valid boundary scan structure is even performed without any clocks or voltages applied to the device under investigation.

14. A computer readable storage device including a computer program product including program code which when executed by a machine cause the machine to perform operations defined in the program code, the operations comprising operations to:

receive, in one or more processors, a device description code enumerating components and connections between the components, wherein the components include scan latches, update latches, multiplexers, input pads, and output pads, and wherein the connections include input paths and output paths, and wherein one or more of the components are part of the boundary scan structure;

traverse, in the one or more processors, the connections and components to determine that the boundary scan structure conforms to a specified design, wherein the traversal of the connections and components includes, a first traversal backwards from the scan latches to the input pads, wherein the first traversal to move through output paths of certain ones of the multiplexers, through input paths of the certain ones, and to the output pads;

a second traversal forwards from the scan latches to the update latches;

a third traversal forwards from the update latches to the output pads, wherein the third traversal to move through input path and output paths of one or more of the multiplexers, and on to the output pads;

record, in a memory device, the paths that lead to the input pads and output pads; and identify, based on the traversing, boundary cells that are part of the boundary scan structure.

15. The computer readable medium of claim 14, wherein the specific design complies with one or more standards including IEEE Standard 1149.1 and IEEE Standard 1149.6.

16. The computer readable medium of claim 14, wherein the device description code includes a netlist.

17. The computer readable medium of claim 14, wherein the device description code is in Electronic Design Interchange Format.

18. The computer readable medium of claim 14, wherein the boundary cells include input boundary cells and output boundary cells.

19. An apparatus comprising:
a processor;
a memory unit including
a device description code identifying components of a device and connections between the components, wherein one or more of the components and connections form boundary cells used for testing the device;
a device analyzer configured to
determine that the components and the connections meet a standard that governs components and connections necessary for the boundary cells;
traverse the connections between the components to determine that the connections meet the standard;
report that the device complies with the standard.

20. The apparatus of claim 19, wherein the devices include one or more of a multiplexer, a scan latch, an update latches, an input pad, and an output pad.

* * * * *